US011335843B2

(12) United States Patent
Lee et al.

(10) Patent No.: US 11,335,843 B2
(45) Date of Patent: May 17, 2022

(54) SEMICONDUCTOR DEVICE PACKAGE

(71) Applicant: SUZHOU LEKIN SEMICONDUCTOR CO., LTD., Taicang (CN)

(72) Inventors: Koh Eun Lee, Seoul (KR); Hui Seong Kang, Seoul (KR); Ga Yeon Kim, Seoul (KR); Yeong June Lee, Seoul (KR); Min Ji Jin, Seoul (KR); Jae Joon Yoon, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 0 days.

(21) Appl. No.: 16/119,469

(22) Filed: Aug. 31, 2018

(65) Prior Publication Data

US 2019/0074422 A1    Mar. 7, 2019

(30) Foreign Application Priority Data

Sep. 5, 2017    (KR) .................... 10-2017-0113439
Aug. 28, 2018   (KR) .................... 10-2018-0101576

(51) Int. Cl.
*H01L 33/60* (2010.01)
*H01L 33/64* (2010.01)
(Continued)

(52) U.S. Cl.
CPC .......... *H01L 33/647* (2013.01); *H01L 33/62* (2013.01); *H01L 33/486* (2013.01); *H01L 33/60* (2013.01); *H01L 2933/0033* (2013.01)

(58) Field of Classification Search
CPC . H01L 33/46; H01L 33/38; H01L 33/48–647; H01L 33/30
See application file for complete search history.

(56) References Cited

U.S. PATENT DOCUMENTS 8,872,414 B2 * 10/2014  Jung .................... H01L 25/167
                                                        313/45
9,893,250 B1 *  2/2018  Ichikawa .............. H01L 33/56
(Continued)

FOREIGN PATENT DOCUMENTS

CN          1855561       11/2006
CN        101267011        9/2008
(Continued)

OTHER PUBLICATIONS

European Search Report dated Nov. 19, 2018 issued in Application No. 18192224.6.
(Continued)

*Primary Examiner* — Eric K Ashbahian
(74) *Attorney, Agent, or Firm* — Birch, Stewart, Kolasch & Birch, LLP

(57) ABSTRACT

A semiconductor device package includes a resin unit having a first through hole and a second through hole, a conductive body disposed on the resin unit and having a cavity that is concave in a first direction from a top surface of the conductive body toward a bottom surface thereof, and a light-emitting device disposed in the cavity, wherein the conductive body includes a first protrusion and a second protrusion, which protrude in the first direction from the bottom surface of the conductive body, and the first protrusion is disposed inside the first through hole, the second protrusion is disposed inside the second through hole, and a top surface of the resin unit is in contact with the bottom surface of the conductive body.

16 Claims, 7 Drawing Sheets

(51) Int. Cl.
*H01L 33/62* (2010.01)
*H01L 33/48* (2010.01)

(56) References Cited

U.S. PATENT DOCUMENTS

| | | |
|---|---|---|
| 2006/0246617 A1 | 11/2006 | Lee et al. |
| 2008/0012036 A1* | 1/2008 | Loh ............... H01L 33/483 257/99 |
| 2011/0116271 A1 | 5/2011 | Ide et al. |
| 2011/0140143 A1 | 6/2011 | Kim et al. |
| 2011/0186902 A1 | 8/2011 | Egoshi et al. |
| 2012/0275181 A1 | 11/2012 | Min |
| 2013/0307000 A1* | 11/2013 | Ikenaga ........... H01L 33/486 257/91 |
| 2014/0084322 A1* | 3/2014 | Park ............... H01L 33/486 257/98 |
| 2014/0291713 A1* | 10/2014 | Lin ................. H01L 33/60 257/98 |
| 2015/0034986 A1* | 2/2015 | Lee ................. H01L 27/15 257/98 |
| 2015/0049447 A1 | 2/2015 | Ahn et al. |
| 2015/0243864 A1* | 8/2015 | Ahn ................. H01L 24/97 257/88 |
| 2015/0280072 A1 | 10/2015 | Nunotani et al. |
| 2015/0349225 A1* | 12/2015 | Oh .................. H01L 24/16 257/99 |
| 2016/0095222 A1* | 3/2016 | Park ............... H01L 33/60 174/255 |
| 2016/0126414 A1* | 5/2016 | Ahn ................. H01L 33/644 257/98 |
| 2016/0155907 A1* | 6/2016 | Ozeki ............... H01L 33/62 257/98 |
| 2016/0190407 A1* | 6/2016 | Ahn ................. H01L 33/62 257/99 |
| 2017/0179351 A1* | 6/2017 | Palaniswamy ..... H01L 21/486 |
| 2017/0222101 A1* | 8/2017 | Shiota .............. H01L 33/62 |

FOREIGN PATENT DOCUMENTS

| | | |
|---|---|---|
| CN | 102064246 A | 5/2011 |
| CN | 102142513 | 8/2011 |
| CN | 104037316 | 9/2014 |
| CN | 104253201 A | 12/2014 |
| CN | 104584244 | 4/2015 |
| CN | 104937732 | 9/2015 |
| CN | 106030832 | 10/2016 |
| CN | 106104820 | 11/2016 |
| CN | 106663731 | 5/2017 |
| DE | 102014103034 A1 | 9/2015 |
| EP | 2323182 A2 | 5/2011 |
| EP | 2819186 A1 | 12/2014 |
| JP | 2003-168828 | 6/2003 |
| JP | 2003-304000 A | 10/2003 |
| JP | 2010-219324 A | 9/2010 |
| JP | 2011-129876 | 6/2011 |
| JP | 2013-46071 A | 3/2013 |
| JP | 2013-145862 | 7/2013 |
| JP | 2015-12287 A | 1/2015 |
| JP | 2015-191910 | 11/2015 |
| KR | 10-2014-0018771 A | 2/2014 |
| KR | 10-1373710 B1 | 3/2014 |

OTHER PUBLICATIONS

Japanese Office Action dated Aug. 27, 2019 issued in JP Application No. 2018-165079.
Chinese Office Action dated Mar. 29, 2021 issued in CN Application No. 201811034004.6.

* cited by examiner

SEMICONDUCTOR DEVICE PACKAGE

CROSS REFERENCE TO RELATED APPLICATIONS

This application claims priority under 35 U.S.C. § 119 to Korean Application No. 10-2017-0113439, filed on Sep. 5, 2017, and Korean Application No. 10-2018-0101576 filed on Aug. 28, 2018, whose entire disclosures are hereby incorporated by reference.

BACKGROUND

1. Field of the Invention

The present invention relates to a semiconductor device package.

2. Discussion of Related Art

Semiconductor devices including a compound, such as gallium nitride (GaN), aluminum gallium nitride (AlGaN), and the like, have many advantages, such as wide and easily adjustable bandgap energy, and may be variously used for a light-emitting device, a light-receiving element, various diodes, and the like.

In particular, light-emitting devices, such as light-emitting diodes (LEDs) and laser diodes (LDs) using Group III-V or Group II-VI compound semiconductor materials of semiconductors, may realize various colors, such as red, green, blue, and ultraviolet (UV) light, with the development of thin-film growth techniques and device materials. The light-emitting devices may realize white light rays having high efficiency by using phosphor materials or combining colors. In addition, the light-emitting devices have merits such as low power consumption, a semi-permanent life span, a fast response speed, safety, and environmental friendliness as compared with conventional light sources, such as fluorescent lamps and incandescent lamps.

Furthermore, when light-receiving elements, such as photodetectors or solar cells, are manufactured using Group III-V or Group II-VI compound semiconductor materials of semiconductors, due to the development of device materials, the light-receiving elements may absorb light having various wavelength ranges and generate photocurrent. Thus, the light-receiving elements may use light in a wide variety of wavelength ranges from gamma rays to a radio wavelength range. Further, since the light-receiving elements has advantages of a fast response speed, safety, environmental friendliness, and easy control of device materials, the light-receiving elements may be easily used for power control circuits, microwave circuits, or communication modules.

Accordingly, applications of semiconductor devices may be extended to transmission modules of optical communication units, LED backlights capable of replacing cold cathode fluorescent lamps (CCFLs) included in backlights of liquid-crystal display (LCD) devices, white LED lighting devices capable of replacing fluorescent lamps or incandescent lamps, car headlights, traffic lights, and sensors configured to detect gas or fire. In addition, the applications of the semiconductor devices may be extended to high-frequency applied circuits, other power control devices, and communication modules.

In particular, light-emitting devices configured to emit light in a UV wavelength range may perform a curing operation or a sterilization operation and be used for curing, medical, and sterilization purposes.

Recently, a large amount of research has been conducted into UV light-emitting device packages. However, UV light-emitting devices still have relatively low light extraction efficiency and cannot effectively emit internal heat to the outside.

SUMMARY OF THE INVENTION

The present invention is directed to providing a semiconductor device package having excellent heat radiation characteristics.

Embodiments provide a semiconductor device package having high light extraction efficiency.

Embodiments provide a semiconductor device package which may inhibit occurrence of burrs during a package cutting process.

Aspects of the embodiments should not be limited by the above descriptions and also include objects or effects that can be understood from the following solutions and embodiments described therein.

According to an aspect of the present invention, there is provided a semiconductor device package including: a resin unit having a first through hole and a second through hole, a conductive body disposed on the resin unit and having a cavity that is concave in a first direction from a top surface of the conductive body toward a bottom surface thereof, and a light-emitting device disposed in the cavity. The conductive body includes a first protrusion and a second protrusion, which protrude in the first direction from the bottom surface of the conductive body. The first protrusion is disposed inside the first through hole, and the second protrusion is disposed inside the second through hole. A top surface of the resin unit is in contact with the bottom surface of the conductive body.

The first protrusion may be larger than the second protrusion.

A ratio of an area of the first protrusion to an area of the second protrusion may range from 1:0.2 to 1:0.6.

The first protrusion and the second protrusion may include aluminum.

The conductive body may include a first metal package body unit, a second metal package body unit, and a first insulating member disposed between the first metal package body unit and the second metal package body unit.

The first insulating member may be exposed at at least two outer side surfaces of a plurality of outer side surfaces of the conductive body.

The first insulating member may be connected to the resin unit.

A distance between the first protrusion and the second protrusion may be greater than a width of the first insulating member.

The resin unit and the first insulating member may include respectively different materials.

The first metal package body unit may include a first recess unit formed to have a thickness that is reduced in a direction toward the second metal package body unit, and a second recess unit formed in a corner region where a side surface of the first metal package body unit meets a bottom surface of the first metal package body unit. The second metal package body unit may include a third recess unit formed to have a thickness that is reduced in a direction toward the first metal package body unit, and a fourth recess unit formed in a corner region where a side surface of the second metal package body unit meets a bottom surface of the second metal package body unit. The resin unit may be disposed in the second recess unit and the fourth recess unit.

The first recess unit, the third recess unit, and the first insulating member may form the cavity.

A bottom surface of the resin unit may be coplanar with a bottom surface of the first protrusion and a bottom surface of the second protrusion.

The first metal package body unit may include a plurality of outer side surfaces and a first adhesive surface that is in contact with the first insulating member. The second metal package body unit may include a plurality of outer side surfaces and a second adhesive surface that is in contact with the first insulating member. The second recess unit of the first metal package body unit may include a first groove formed in a region where the bottom surface of the first metal package body unit meets the outer side surfaces of the first metal package body unit and a third groove formed in a region where the bottom surface of the first metal package body unit meets the first adhesive surface of first metal package body unit. The fourth recess unit of the second metal package body unit may include a second groove formed in a region where the bottom surface of the second metal package body unit meets the outer side surfaces of the second metal package body unit and a fourth groove formed in a region where the bottom surface of the second metal package body unit meets the second adhesive surface of the second metal package body unit. The third groove and the fourth groove may be connected to each other.

The resin unit may include a second insulating member disposed in the first groove and the second groove and a third insulating member disposed in the third groove and the fourth groove. A width of the third insulating member may be greater than a width of the first insulating member.

A thickness of the second insulating member may be different from a thickness of the third insulating member.

A thickness of the second insulating member may be greater than a thickness of the third insulating member.

A width of the second insulating member may be smaller than the width of the third insulating member.

The second insulating member may include the same material as the third insulating member, and the third insulating member may include a different material from the first insulating member.

The semiconductor device package may further include a light-transmissive member disposed on a step unit formed on an inner sidewall of the cavity.

A ratio of a width of the first groove to a width of the bottom surface of the first metal package body unit may range from 1:3 to 1:5.

According to another aspect of the present invention, there is provided a semiconductor device package including: a first metal package body unit; a second metal package body unit spaced apart from the first metal package body unit by a first insulating member; a light-emitting device electrically connected to the first metal package body unit and the second metal package body unit; and a light-transmissive member disposed on the first metal package body unit and the second metal package body unit. An upper portion of the first metal package body unit includes a first recess unit formed by reducing a thickness of the first metal package body unit. A lower portion of the first metal package body unit includes a second recess unit formed along a plurality of outer side surfaces. An upper portion of the second metal package body unit includes a third recess unit formed by reducing a thickness of the second metal package body unit. A lower portion of the second metal package body unit includes a fourth recess unit formed along a plurality of outer side surfaces. The first recess unit, the third recess unit, and the first insulating member form a cavity. The light-emitting device is disposed in the cavity and includes a second insulating member disposed in the second recess unit and the fourth recess unit.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

The embodiments may be modified in other forms, or several embodiments may be combined with one another. The scope of the present invention is not limited to each of the embodiments described below.

Even when content described in a specific embodiment is not described in other embodiments, the content may be understood as being related to other embodiments unless described otherwise or the content contradicts specific embodiment in the other embodiments.

For example, when features of a component A are described in a specific embodiment and features of a component B are described in another embodiment, it should be understood that embodiments in which the component A is combined with the component B fall within the scope and spirit of the present invention even when they are not explicitly described.

In the description of the embodiments, it will be understood that when an element is referred to as being "on or under" another element, the two elements may be in direct contact with each other or at least one intervening element may be present between the two elements. Further, the term "on or under" can encompass both an orientation of above and below on the basis of one element.

Exemplary embodiments of the present invention that can be easily implemented by one skilled in the art will now be described more fully with reference to the accompanying drawings in which the exemplary embodiments of the invention are shown.

Figure 1:
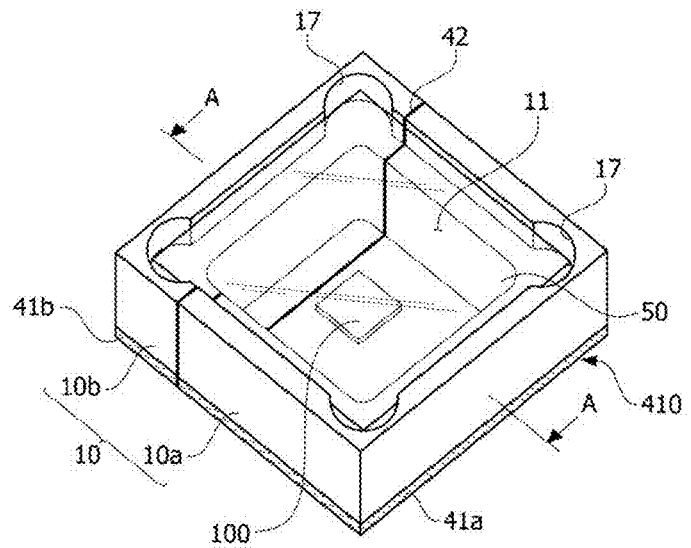
FIG. 1 is a perspective view of a semiconductor device package according to an exemplary embodiment of the present invention.
Figure 2:
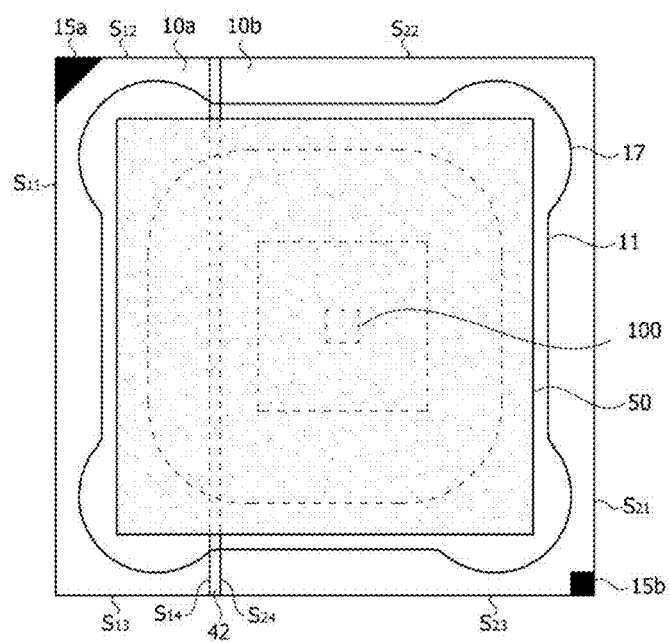
FIG. 2 is a plan view of a semiconductor device package according to an exemplary embodiment of the present invention.
Figure 3:
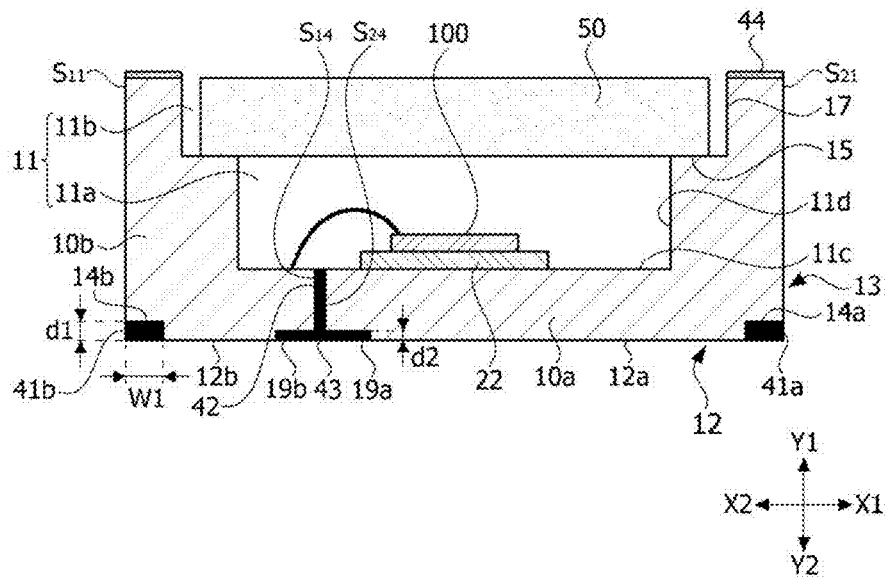
FIG. 3 is a cross-sectional view of a semiconductor device package according to an exemplary embodiment of the present invention.
Figure 4:
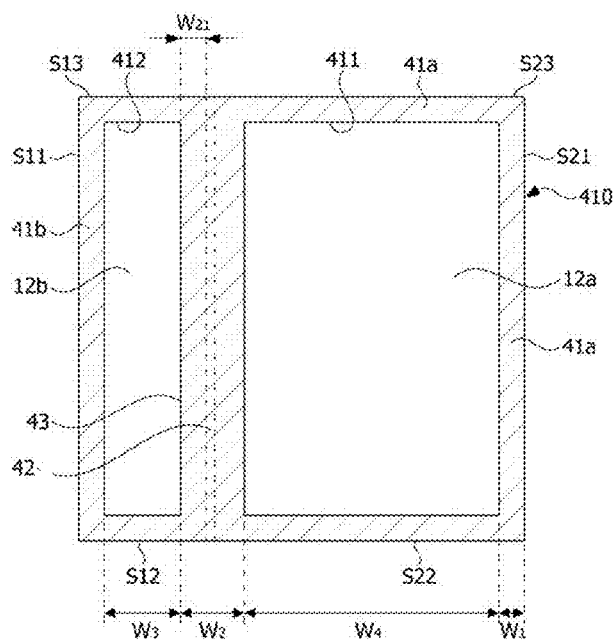
FIG. 4 is a bottom view of a semiconductor device package according to an exemplary embodiment of the present invention.
Figure 5:
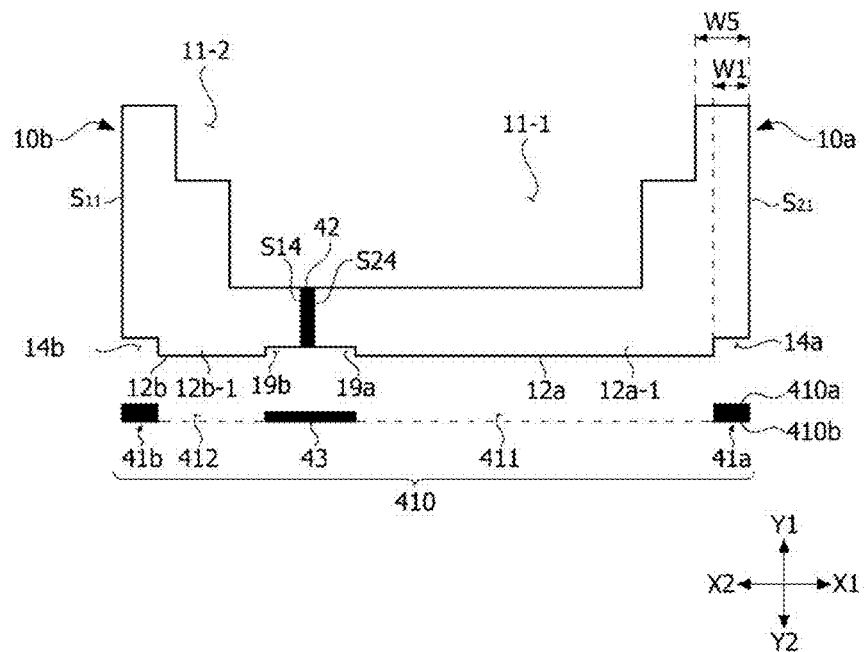
FIG. 5 is an exploded view of FIG. 3.

FIG. 1 is a perspective view of a semiconductor device package according to an exemplary embodiment of the present invention. FIG. 2 is a plan view of a semiconductor device package according to an exemplary embodiment of the present invention. FIG. 3 is a cross-sectional view of a semiconductor device package according to an exemplary embodiment of the present invention. FIG. 4 is a bottom view of a semiconductor device package according to an exemplary embodiment of the present invention. FIG. 5 is an exploded view of FIG. 3.

Referring to FIGS. 1 and 2, the semiconductor device package according to the exemplary embodiment may include a body 10 including a cavity 11, a semiconductor device 100 disposed inside the cavity 11, and a light-transmissive member 50 disposed on the cavity 11.

The body 10 may be manufactured by processing an aluminum substrate. Accordingly, both an inner surface and an outer surface of the body 10 according to the exemplary embodiment may have conductivity. The above-described structure of the body 10 may have various merits. When a non-conductive material, such as aluminum nitride (AlN) and aluminum oxide ($Al_2O_3$), is used for the body 10, since a reflectance of the body 10 in an ultraviolet (UV) wavelength band is only 20 to 40%, an additional reflective member should be disposed. Further, additional conductive members, such as lead frames, and a circuit pattern may be needed. Accordingly, manufacturing costs may increase, and processes may be complicated. In addition, a conductive member, such as gold (Au) may absorb UV light to reduce light extraction efficiency.

However, according to the exemplary embodiment, since the body 10 itself is formed of aluminum, a reflectance of the body 10 in the UV wavelength band may be high so that an additional reflective member may be omitted. Further, since the body 10 itself has conductivity, additional circuit patterns and lead frames may be omitted. In addition, since the body 10 is formed of aluminum, the body 10 may have a good thermal conductivity of 140 W/m·k to 160 W/m·k. Accordingly, heat radiation efficiency may be improved.

The body 10 may include a first metal package body unit 10a and a second metal package body unit 10b. A first insulating member 42 may be disposed between the first metal package body unit 10a and the second metal package body unit 10b. Since both the first metal package body unit 10a and the second metal package body unit 10b have conductivities, it may be necessary to dispose the first insulating member 42 to separate a polarity of the first metal package body unit 10a from a polarity of the second metal package body unit 10b.

The first insulating member 42 may include any one of various materials having an insulation function. As an example, the first insulating member 42 may include a resin, such as polyimide (PI), but the present invention is not limited thereto. A thickness of the first insulating member 42 may range from 10 µm to 100 µm. When the thickness of the first insulating member 42 is 10 µm or more, the first metal package body unit 10a may be sufficiently insulated from the second metal package body unit 10b. When the thickness of the first insulating member 42 is 100 µm or less, a problem of increasing the size of a package may be reduced.

The body 10 may include a cavity 11, which is concave in a first direction from a top surface of the body 10 toward a bottom surface 12 thereof. Further, the body 10 may include a first alignment mark 15a and a second alignment mark 15b, which are disposed on the top surface of the body 10. The first alignment mark 15a may have a different shape from that of the second alignment mark 15b. As an example, the first alignment mark 15a may have a triangular shape, and the second alignment mark 15b may have a tetragonal shape, but the present invention is not limited thereto.

The body 10 may be disposed on a resin unit 410. The resin unit 410 may be disposed along a corner region between an outer side surface and the bottom surface of the body 10. According to an exemplary embodiment, since the resin unit 410 is disposed under the body 10, occurrence of burrs may be reduced during a package cutting process.

The first insulating member 42 may be formed through at least two outer side surfaces of a plurality of outer side surfaces of the body 10 having conductivity and a bottom surface of the cavity 11. Accordingly, the first insulating member 42 may be exposed at the outer side surface of the body 10.

The outer side surface of the body 10 having conductivity, an outer side surface of the resin unit 410, and an exposed surface of the first insulating member 42 may all be coplanar with each other. That is, the outer side surface of the resin unit 410 and the exposed surface of the first insulating member 42 may form one vertical surface with the outer side surface of the body 10 having conductivity.

The first metal package body unit 10a may be disposed to face the second metal package body unit 10b and include an inner side surface S14 on which the first insulating member 42 is disposed between the first and second metal package body units 10a and 10b, and outer side surfaces S11, S12, and S13 that constitute a side surface of the body 10. The inner side surface S24 may be a first adhesive surface that is in contact with the first insulating member 42.

The second metal package body unit 10b may be disposed to face the first metal package body unit 10a, and the inner side surface S24 on which the first insulating member 42 is disposed between the first and second metal package body units 10a and 10b and outer side surfaces S21, S22, and S23 that constitute the side surface of the body 10. The inner side surface S14 may be a second adhesive surface that is in contact with the first insulating member 42.

Referring to FIGS. 3 and 4, the cavity 11 may be disposed in the top surface of the body 10 and have a bottom surface 11c and an inclined surface 11d. Since the first insulating member 42 is formed through two opposite outer side surfaces of the body 10, the first insulating member 42 may be exposed at the bottom surface 11c and the inclined surface 11d of the cavity 11.

The inclined surface 11d of a first cavity 11a may be disposed in a vertical direction to the bottom surface 11c thereof. However, the present invention is not limited thereto, and the inclined surface 11d may be inclined at an angle larger than 90° with the bottom surface 11c so that light emitted by the semiconductor device 100 may be reflected upward. As described above, since the body 10 is manufactured using aluminum, even if an additional reflective member is not provided, an inner surface of the cavity 11 may reflect light having a UV wavelength band upward.

A second cavity 11b may be disposed on the first cavity 11a and has such a diameter as to dispose the light-transmissive member 50. The light-transmissive member 50 may be supported by a step unit 15 between the first cavity 11a and the second cavity 11b. The second cavity 11b may include a plurality of recesses 17, which may protrude toward corners of the body 10 at an outer circumferential surface of the second cavity 11b.

The body 10 may include first and second grooves 14a and 14b, which are disposed at corners where the bottom surface 12 of the body 10 meets a side surface 13 of the body 10, and a second insulating member 41a and 41b disposed in the first and second grooves 14a and 14b. The first and second grooves 14a and 14b may be wholly disposed along corner regions where the bottom surface 12 of the body 10 meets the side surface 13 thereof.

Specifically, the body 10 may include the first groove 14a, which is disposed in a region where a bottom surface 12a of the first metal package body unit 10a meets the outer side surfaces S21, S22, and S23, and the second groove 14b, which is disposed in a region where the bottom surface 12b of the second metal package body unit 10b meets the outer side surfaces S11, S12, and S13.

The second insulating member 41a and 41b may include a 2-$1^{st}$ insulation unit 41a disposed in the first groove 14a and a 2-$2^{nd}$ insulation unit 41b disposed in the second groove 14b. In this case, the 2-$1^{st}$ insulation unit 41a may be integrally formed with the 2-$2^{nd}$ insulation unit 41b.

Shapes of the first groove 14a and the second groove 14b are not specifically limited. A sectional shape of the first groove 14a and the second groove 14b may include any one of a polygonal shape, a lens shape, and the like.

The second insulating member 41a and 41b may be formed of the same material as the first insulating member 42. The first insulating member 42 and the second insulating member 41a and 41b may be formed of one selected from a modified epoxy resin composition, such as an epoxy mold compound (EMC), white silicone, photoimageable solder resist (PSR), a silicone resin composition, a silicone modified epoxy resin, and the like, a modified silicone resin composition, such as an epoxy-modified silicone resin and the like, and a resin such as a polyimide resin composition, a modified polyimide resin composition, polyphthalamide (PPA), a polycarbonate resin, a polyphenylene sulfide (PPS), a liquid crystal polymer (LCP), an acrylonitrile butadiene styrene (ABS) resin, a phenol resin, an acryl resin, a polybutylene terephthalate (PBT) resin, and the like.

However, the present invention is not limited thereto, and a material for the first insulating member 42 may be different from a material for the second insulating member 41a and 41b. As an example, the first insulating member 42 may include a polyimide (PI)-based adhesive material. Accordingly, the first insulating member 42 may include a material having a higher heat resistance than that of the second insulating member 41a and 41b.

In this case, the first insulating member 42 may be prevented from breaking or cracking even in a high-temperature high-pressure environment, which is produced during the formation of the first insulating member 42, or in a high-temperature environment of about 320° C. which is produced during a die-bonding process such as a eutectic process, a silver (Ag) paste process, and the like.

According to the embodiment, since the second insulating member 41a and 41b is disposed at lower corners of the body 10, burrs may be prevented from occurring at the corners of the body 10 during a package cutting process. Since an aluminum substrate includes a metal material, burrs may easily occur in the aluminum substrate during a cutting process. When the burrs occur, the bottom surface 12 of the body 10 may not be flat such that the semiconductor device package may be poorly mounted on a circuit substrate. Further, when the burrs occur, a thickness of the body 10 may be non-uniform, and a partial region of the body 10 may be lifted which may cause measurement errors. Since the second insulating member 41a and 41b is formed of an insulating material, burrs may not be easily generated during a cutting process.

Inner surfaces of the first groove 14a and the second groove 14b may have roughness (not shown). When the inner surfaces of the first and second grooves 14a and 14b are smooth, adhesion of the first and second grooves 14a and 14b with the second insulating member 41a and 41b may be weak. Accordingly, the inner surfaces of the first and second grooves 14a and 14b may have roughness through a surface treatment process to fix the second insulating member 41a and 41b.

A first-directional thickness (Y-directional width or d1) of the second insulating member 41a and 41b may range from 50 μm to 150 μm. A first direction (or Y direction) may be a direction from the bottom surface 12 of the body 10 toward the top surface thereof. When the first-directional thickness d1 of the second insulating member 41a and 41b is 50 μm or more, a sufficient thickness may be ensured to prevent occurrence of burrs during a package cutting process. When the first-directional thickness d1 of the second insulating member 41a and 41b is 150 μm or less, the second insulating member 41a and 41b may be prevented from protruding from the bottom surface 12 of the body 10.

A second-directional width (X-directional width w1) of the second insulating member 41a and 41b may range from 100 μm to 300 μm. A second direction (or X direction) may be a direction orthogonal to the first direction. When the second-directional width w1 of the second insulating member 41a and 41b is 100 μm or more, the second insulating member 41a and 41b may be sufficiently fixed to the first groove 14a and the second groove 14b. When the second-directional width w1 of the second insulating member 41a and 41b is 300 μm or less, the bottom surface 12 of the body 10 may ensure a sufficient area for an electrode to be mounted thereon.

According to the exemplary embodiment, a ratio d1:w1 of the thickness d1 of the second insulating member 41a and 41b to the width w1 thereof may range from 1:1.5 to 1:6. That is, the width w1 of the second insulating member 41a and 41b may be greater than the thickness d1 thereof. When the above-described ratio d1:w1 is satisfied, the second insulating member 41a and 41b may be sufficiently fixed to the first groove 14 to inhibit occurrence of burrs.

The body 10 may include a third groove 19a disposed in a region where the bottom surface 12a of the first metal package body unit 10a meets the inner side surface S24, a fourth groove 19b disposed in a corner region where the bottom surface 12b of the second metal package body unit 10b meets the inner side surface S14, and a third insulating member 43 disposed in the third groove 19a and the fourth groove 19b.

The third insulating member 43 may be disposed in the bottom surface 12 of the body 10 and connected to the second insulating member 41a and 41b and the first insulating member 42. Further, the third insulating member 43 may overlap the first insulating member 42 in the first direction (Y direction). In this case, a length of the first insulating member 42 may be greater than a length of the third insulating member 43 in the first direction (Y direction).

The first to fourth grooves 14a, 14b, 19a, and 19b may be formed at the same time. Further, the second insulating member 41a and 41b and the third insulating member 43 may be formed using one coating process. Accordingly, a material for the third insulating member 43 may be the same as a material for the second insulating member 41a and 41b, but the present invention is not limited thereto.

The bottom surface 12a of the first metal package body unit 10a, the bottom surface 12b of the second metal package body unit 10b, a bottom surface of the second insulating member 41a and 41b, and a bottom surface of the third insulating member 43 may be coplanar with each other. That is, the second insulating member 41a and 41b and the third insulating member 43 may not protrude from the bottom surface 12 of the body 10 but entirely form a planar surface. Accordingly, when the semiconductor device package is mounted on a circuit substrate, a failure rate may be reduced, and a thickness of a package may be reduced.

A thickness (Y-directional width or d2) of the third insulating member 43 may range from 10 μm to 100 μm. When the thickness of the third insulating member 43 is 10 μm or more, the third insulating member 43 may be tightly fixed to the second groove 19. When the thickness of the third insulating member 43 is 100 μm or less, the second groove 19 may be controlled to have a small depth so that a thickness of a region in which the semiconductor device 100 is mounted may be ensured. The region in which the semiconductor device 100 is mounted may be a thinnest region of the body 10 because the cavity 11 is formed in the region in which the semiconductor device 100 is mounted. Thus, it may be advantageous to form the second groove 19 to be as shallow as possible.

A width (X-directional width or w2) of the third insulating member 43 may range from 300 μm to 700 μm. When the width w2 of the third insulating member 43 is 300 μm or more, the bottom surface 12a of the first metal package body unit 10a may be sufficiently spaced apart from the bottom surface 12b of the second metal package body unit 10b so as to prevent occurrence of a short. When the width w2 of the third insulating member 43 is 700 μm or less, the bottom surface 12 of the body 10 may ensure a sufficient area for mounting an electrode. Accordingly, the width w2 of the third insulating member 43 may be greater than the width w1 of the second insulating member 41a and 41b.

The thickness d1 of the second insulating member 41a and 41b may be greater than the thickness d2 of the third insulating member 43. The region in which the semiconductor device 100 is mounted may be the thinnest region of the body 10 because the cavity 11 is formed in the region in which the semiconductor device 100 is mounted. Thus, it may be advantageous to form the second groove 19 to be as shallow as possible. Further, the second insulating member 41a and 41b may have a predetermined thickness to prevent occurrence of burrs. As a result, when the thickness d1 of the second insulating member 41a and 41b is greater than the thickness d2 of the third insulating member 43, occurrence of burrs may be effectively prevented, and a sufficient strength of the package may be ensured.

However, the present invention is not limited thereto, and a thickness d1 of the second insulating member 41a and 41b may be equal to a thickness d2 of the third insulating member 43.

Since the body 10 has conductivity as described above, each of the bottom surface 12a of the first metal package body unit 10a and the bottom surface 12b of the second metal package body unit 10b may have conductivity. In this case, the second insulating member 41a and 41b may be disposed along the corners of the body 10 and surround the bottom surface 12a of the first metal package body unit 10a and the bottom surface 12b of the second metal package body unit 10b, and the third insulating member 43 may be disposed between the bottom surface 12a of the first metal package body unit 10a and the bottom surface 12b of the second metal package body unit 10b. Both ends of the third insulating member 43 in a lengthwise direction may be in contact with the second insulating member 41a and 41b.

The bottom surface 12a of the first metal package body unit 10a may have an area greater than that of the bottom surface 12b of the second metal package body unit 10b. A ratio of an area of the bottom surface 12a of the first metal package body unit 10a to an area of the bottom surface 12b of the second metal package body unit 10b may range from 1:0.2 to 1:0.6. When the above-described area ratio is 1:0.2 or more, the area of the bottom surface 12b of the second metal package body unit 10b may be ensured to be sufficient to prevent occurrence of a short. When the above-described area ratio is 1:0.6 or less, a sufficient space for disposing a sub-mount on the bottom surface 12a of the first metal package body unit 10a may be ensured.

A ratio w1:w4 of the width w1 of a bottom surface of the first groove 14a to a width w4 of the bottom surface 12a of the first metal package body unit 10a may range from 1:3 to 1:5. When the ratio w1:w4 is 1:3 or more, an area of the bottom surface 12a of the first metal package body unit 10a may increase so that a sufficient area for mounting the sub-mount may be ensured. When the ratio w1:w4 is 1:5 or less, a width of the second insulating member 41a and 41b may increase so that occurrence of burrs may be effectively inhibited.

A ratio w21:w4 of a width w21 of a bottom surface of the third groove 19a to the width w1 of the bottom surface of the first groove 14a may range from 1:0.8 to 1:1.2. That is, the width w2 of the third insulating member 43 may be at least twice the width w1 of the second insulating member 41a and 41b. Accordingly, the bottom surface 12a of the first metal package body unit 10a may be sufficiently spaced apart from the bottom surface 12b of the second metal package body unit 10b so that occurrence of a short may be prevented.

A fourth insulating member 44 may be disposed on the top surface of the body 10. The fourth insulating member 44 may be formed of the same material as, or a different material from, the first and second insulating members 42 and 41. A thickness of the fourth insulating member 44 may be smaller than that of the second insulating member 41a and 41b.

The semiconductor device 100 may be disposed inside the cavity 11. The semiconductor device 100 may be electrically connected to the first metal package body unit 10a and the second metal package body unit 10b. A sub-mount 22 may be disposed in the cavity 11, and the semiconductor device 100 may be disposed on the sub-mount 22. A pad unit (not shown) to which a wire is bonded may be disposed on a bottom surface of the cavity 11.

The semiconductor device 100 may output light having a UV wavelength band. As an example, the semiconductor device 100 may output light UV-A having a near-UV wavelength band, output light UV-B having a far-UV wavelength band, or output light UV-C having a deep-UV wavelength band. A wavelength range of the semiconductor device 100 may be determined by an Al content of an emission structure 120.

In an example, the light UV-A having the near-UV wavelength band may have a peak wavelength in a range of 320 nm to 390 nm, the light UV-B having the far-UV wavelength band may have a peak wavelength in a range of 280 nm to 320 nm, and the light UV-C having the deep-UV wavelength band may have a peak wavelength in a range of 100 nm to 280 nm.

The light-transmissive member 50 may be disposed on the cavity 11. The light-transmissive member 50 may be supported by the step unit 15 disposed between the first cavity 11a and the second cavity 11b. An adhesive layer (not shown) may be disposed between the step unit 15 and the light-transmissive member 50. When the adhesive layer is excessively filled, the remaining adhesive may move back into the recess 17. Accordingly, even if the adhesive is excessively coated, the light-transmissive member 50 may be maintained to be level.

A material for the light-transmissive member 50 is not specifically limited and may be any material capable of transmitting light having a UV wavelength band. As an example, the light-transmissive member 50 may include an optical material (e.g., quartz) having a high UV-wavelength transmittance, but the present invention is not limited thereto.

Referring to FIG. 5, the body 10 may be disposed on the resin unit 410. That is, a top surface 410a of the resin unit 410 may be in contact with the bottom surface 12 of the body 10. The resin unit 410 may include a first through hole 411 and a second through hole 412, which may be formed through the top surface 410a and a bottom surface 410b of the resin unit 410.

The body 10 may include a first protrusion 12a-1, which protrudes from the bottom surface 12 of the body 10 and is disposed in the first through hole 411, and a second protrusion 12b-1, which protrudes from the bottom surface 12 of the body 10 and is disposed in the second through hole 412. Accordingly, the bottom surface 12a of the first protrusion 12a-1, the bottom surface 12b of the second protrusion 12b-1, and the bottom surface 410b of the resin unit 410 may be coplanar with each other. The first and second protrusions 12a-1 and 12a-2 may include the same aluminum material as that of the body 10.

The first through hole 411 may be larger than the second through hole 412.

Accordingly, a size of the first protrusion 12a-1 may be larger than that of the second protrusion 12b-1.

A ratio of an area of the first protrusion 12a-1 to an area of the second protrusion 12b-1 may range from 1:0.2 to 1:0.6. When the area ratio is 1:0.2 or more, the area of the second protrusion 12b-1 may be ensured to be sufficient to prevent occurrence of a short. When the area ratio is 1:0.6 or less, a sufficient space for disposing a sub-mount on the first protrusion 12a-1 may be ensured.

A distance W2 between the first protrusion 12a-1 and the second protrusion 12b-1 may be greater than a width of the first insulating member 42. Accordingly, a width of the third insulating member 43 disposed between the first protrusion 12a-1 and the second protrusion 12b-1 may be increased to prevent occurrence of a short.

The first metal package body unit 10a may include a first recess unit 11-1 of which a thickness is reduced in a direction (X2 direction) toward the second metal package body unit 10b, and a second recess unit 14a and 19a, which are formed at the corner regions where the side surfaces S21, S22, S23, and S24 of the first metal package body unit 10a meet the bottom surface 12a thereof.

The second metal package body unit 10b may include a second recess unit 11-2 of which a thickness is reduced in a direction (X1 direction) toward the first metal package body unit 10a, and a fourth recess unit 14b and 19b, which are formed at the corner regions where the side surfaces S11, S12, S13, and S14 of the second metal package body unit 10b meet the bottom surface 12b thereof. Top surfaces of the first recess unit 11-1, the second recess unit 11-2, and the first insulating member 42 may form the cavity 11 of the body 10.

The second recess unit 14a and 19a of the first metal package body unit 10a may include the first groove 14a, which is disposed in a region where the bottom surface 12a of the first metal package body unit 10a meets the outer side surfaces S21, S22, and S23 of the first metal package body unit 10a, and the third groove 19a, which is disposed in a region where the bottom surface 12a of the first metal package body unit 10a meets the first adhesive surface S24 of the first metal package body unit 10a.

The fourth recess unit 14b and 19b of the second metal package body unit 10b may include the second groove 14b, which is disposed in a region where the bottom surface 12b of the second metal package body unit 10b meets the outer side surfaces S11, S12, and S13, and the fourth groove 19b, which is disposed in a region where the bottom surface 12b of the second metal package body unit 10b meets the second adhesive surface S14 of the second metal package body unit 10b. In this case, the third groove 19a may be connected to the fourth groove 19b.

The resin unit 410 may include the second insulating member 41a and 41b, which are disposed in the first groove 14a and the second groove 14b, and the third insulating member 43, which is disposed in the third groove 19a and the fourth groove 19b. Accordingly, the resin unit 410 may include all the above-described characteristics of the second insulating member 41a and 41b and the third insulating member 43.

That is, a thickness of the second insulating member 41a and 41b may be greater than a thickness of the third insulating member 43, and a width of the second insulating member 41a and 41b may be smaller than a width of the third insulating member 43.

In addition, a material for the second insulating member 41a and 41b and the third insulating member 43 may be different from a material for the first insulating member 42.

A width W1 of the second insulating member 41a and 41b may be smaller than a width W5 of the top surface of the body 10. The width W1 of the second insulating member 41a and 41b may range from 50% to 90% of the width W5 of the top surface of the body 10. Due to the above-described structure, a sufficient area for mounting an electrode under the body 10 may be ensured and a sufficient width of the second insulating member 41a and 41b may be ensured, thereby obtaining an adhesion of the second insulating member 41a and 41b with the body 10.

Figure 6A:
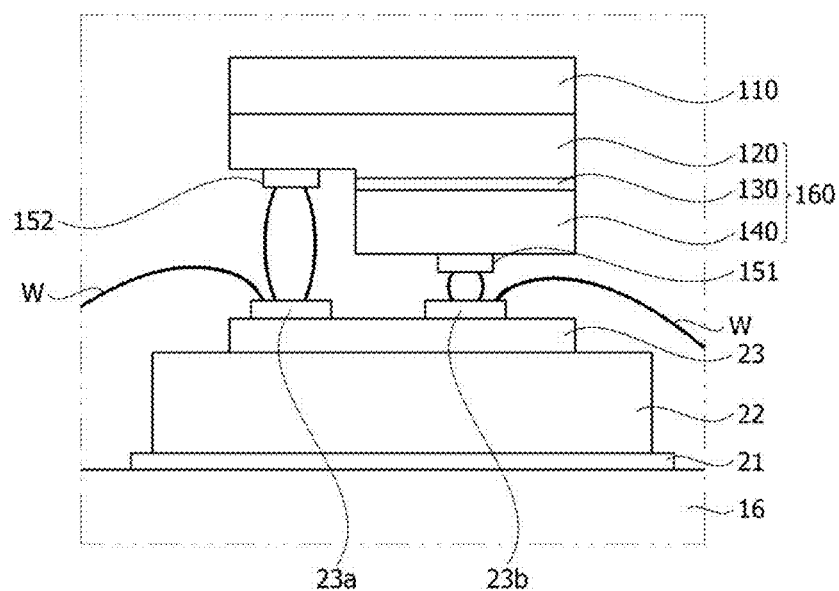
FIG. 6A is a conceptual diagram of a semiconductor device according to an exemplary embodiment of the present invention.
Figure 6B:
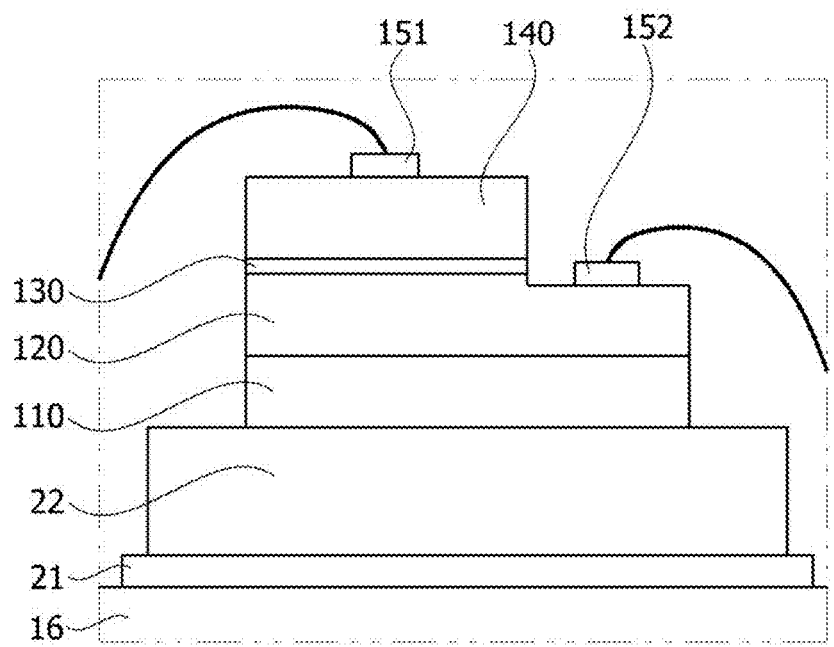
FIG. 6B illustrates a modified example of FIG. 6A.

FIG. 6A is a conceptual diagram of a semiconductor device 100 according to an exemplary embodiment of the present invention, and FIG. 6B illustrates a modified example of FIG. 6A.

Referring to FIG. 6A, the semiconductor device 100 according to the exemplary embodiment may be mounted as a flip-chip type on a sub-mount 22. That is, a first electrode 152 and a second electrode 151 of the semiconductor device 100 may be mounted as a flip-chip type on a first pad 23a and a second pad 23b of the sub-mount 22. In this case, each of the first pad 23a and the second pad 23b may be soldered to the body 10 using wires W.

However, a method of mounting the semiconductor device 100 is not specifically limited. For example, as shown in FIG. 6B, a substrate 110 of the semiconductor device 100 may be disposed on the sub-mount 22, and the first electrode 152 and the second electrode 151 may be directly soldered to the body 10.

The semiconductor device 100 according to the exemplary embodiment may include a substrate 110, a first-conductivity-type semiconductor layer 120, an active layer 130, and a second-conductivity-type semiconductor layer 140. Each of the first- and second-conductivity-type semiconductor layers 120 and 140 may include an aluminum composition to emit light having a UV wavelength band.

The substrate 110 may include a conductive substrate or an insulating substrate. The substrate 110 may include a material suitable for growing a semiconductor material or being a carrier wafer. The substrate 110 may be formed of a material selected from sapphire ($Al_2O_3$), silicon carbide (SiC), gallium arsenide (GaAs), gallium nitride (GaN), zinc oxide (ZnO), silicon (Si), gallium phosphide (GaP), indium phosphide (InP), and germanium (Ge), but the present invention is not limited thereto. The substrate 110 may be removed when necessary.

A buffer layer (not shown) may be further provided between the first-conductivity-type semiconductor layer 120 and the substrate 110. The buffer layer may reduce lattice mismatch between an emission structure 160 provided on the substrate 110 and the substrate 110.

The first-conductivity-type semiconductor layer 120 may be implemented as a compound semiconductor, such as a Group III-V compound semiconductor or a Group II-VI compound semiconductor, and a first dopant may be doped into the first-conductivity-type semiconductor layer 120. The first-conductivity-type semiconductor layer 120 may be selected out of semiconductor materials (e.g., GaN, AlGaN, InGaN, and InAlGaN) having a composition formula of $In_{x1}Al_{y1}Ga_{1-x1-y1}N$ ($0 \leq x1 \leq 1$, $0 \leq y1 \leq 1$, $0 \leq x1+y1 \leq 1$). Further, the first dopant may be an n-type dopant, such as silicon (Si), germanium (Ge), tin (Sn), selenium (Se), and tellurium (Te). When the first dopant is the n-type dopant, the first-conductivity-type semiconductor layer 120 doped with the first dopant may be an n-type semiconductor layer.

The active layer 130 may be a layer in which electrons (or holes) injected through the first-conductivity-type semiconductor layer 120 meet holes (or electrons) injected through the second-conductivity-type semiconductor layer 140. As the electrons and the holes transition to a low energy level due to recombination therebetween, the active layer 130 may generate light having a wavelength corresponding to the energy difference.

The active layer 130 may have any one of a single well structure, a multiple well structure, a single quantum well (SQW) structure, a multiple quantum well (MQW) structure, a quantum dot structure, or a quantum wire structure, and the structure of the active layer 130 is not limited thereto.

The second-conductivity-type semiconductor layer 140 may be formed on the active layer 130 and implemented as a compound semiconductor, such as a Group III-V compound semiconductor and a Group II-VI compound semiconductor, and a second dopant may be doped into the second-conductivity-type semiconductor layer 140. The second-conductivity-type semiconductor layer 140 may be formed of a semiconductor material having a composition formula of $In_{x5}Al_{y2}Ga_{1-x5-y2}N$ ($0 \leq x5 \leq 1$, $0 \leq y2 \leq 1$, $0 \leq x5+y2 \leq 1$) or a material selected out of aluminum indium nitride (AlInN), aluminum gallium arsenide (AlGaAs), gallium phosphide (GaP), gallium arsenide (GaAs), gallium arsenide phosphide (GaAsP), and aluminum gallium indium phosphide (AlGaInP). When the second dopant is a p-type dopant, such as magnesium (Mg), zinc (Zn), calcium (Ca), strontium (Sr), and barium (Ba), the second-conductivity-type semiconductor layer 140 doped with the second dopant may be a p-type semiconductor layer.

The first electrode 152 may be electrically connected to the first-conductivity-type semiconductor layer 120, and the second electrode 151 may be electrically connected to the second-conductivity-type semiconductor layer 140. The first and second electrodes 152 and 151 may be formed of one selected from titanium (Ti), ruthenium (Ru), rhodium (Rh), iridium (Ir), magnesium (Mg), zinc (Zn), aluminum (Al), indium (In), tantalum (Ta), palladium (Pd), cobalt (Co), nickel (Ni), silicon (Si), germanium (Ge), silver (Ag), gold (Au), and a selected alloy thereof.

Although the exemplary embodiment illustrates a structure of a horizontal light-emitting device, the present invention is not limited thereto. For example, the light-emitting device according to the exemplary embodiment may have a vertical structure or a flip-chip structure.

Figure 7:
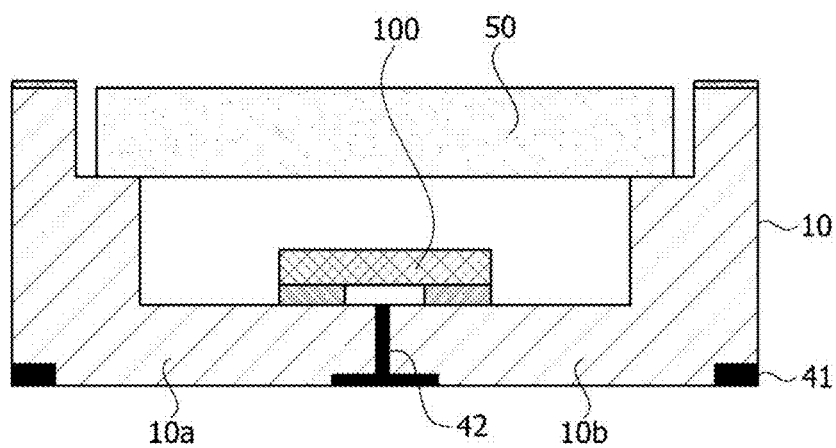
FIG. 7 is a cross-sectional view of a semiconductor device package according to another exemplary embodiment of the present invention.
Figure 8:
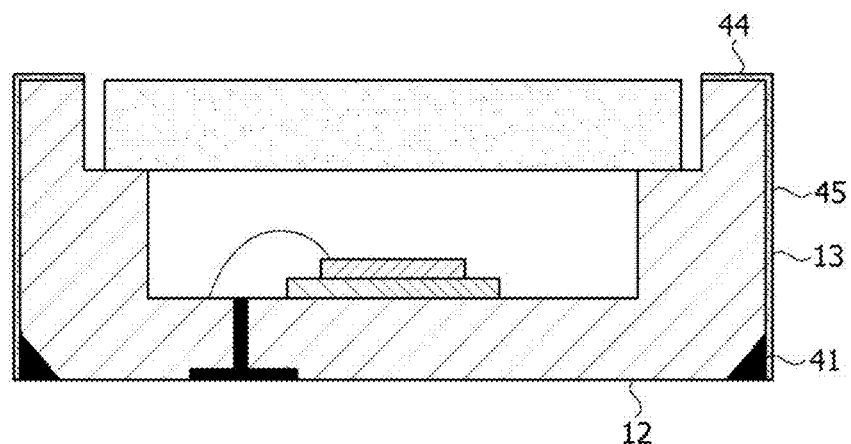
FIG. 8 is a cross-sectional view of a semiconductor device package according to still another exemplary embodiment of the present invention.
Figure 9:
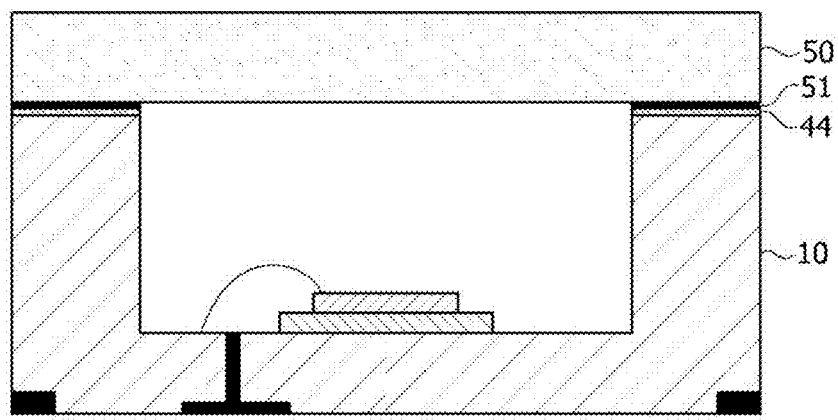
FIG. 9 illustrates a modified example of FIG. 1.

FIG. 7 is a cross-sectional view of a semiconductor device package according to another exemplary embodiment of the present invention. FIG. 8 is a cross-sectional view of a semiconductor device package according to still another exemplary embodiment of the present invention. FIG. 9 illustrates a modified example of FIG. 1.

Referring to FIG. 7, a first insulating member 42 may be disposed in the center of a bottom surface 12 of a body 10. A position of the first insulating member 42 may be freely changed in a structure from which a sub-mount is omitted. In this case, a first metal package body unit 10a and a second metal package body unit 10b may have shapes that are symmetrical to each other.

Referring to FIG. 8, a thickness of a second insulating member 41 may be reduced away from a side surface 13 of the body 10. According to the above-described configuration, since the second insulating member 41a and 41b has a great thickness on the side surface 13 of the body 10, occurrence of burrs may be effectively inhibited during a package cutting process. Further, a bottom surface 12 of the body 10 may be maximally ensured so that a sufficient area of the bottom surface 12 of the body 10 for an electrode to be mounted thereon may be ensured. However, the present invention is not limited thereto, and the thickness of the second insulating member 41a and 41b may not be continuously reduced but may be reduced in a staircase form away from the side surface 13 of the body 10.

A fifth insulation unit 45 may be disposed on the side surface 13 of the body 10. The fifth insulation unit 45 may be connected to the fourth insulating member 44 disposed on the top surface of the body 10. Since the body 10 according to the embodiment is formed of aluminum, the body 10 may be vulnerable to electrostatic discharge (ESD). The fourth insulating member 44 and the fifth insulation unit 45 may be disposed on an outer surface of the body 10 and protect an outer appearance of the body 10 and prevent ESD and a short.

The fifth insulation unit 45 may have a thickness of 10 μm to 100 μm. When the thickness of the fifth insulation unit 45 is less than 10 μm, it may be difficult to ensure sufficient insulation of the outer surface of the body 10. When the thickness of the fifth insulation unit 45 is more than 100 μm, there is a problem in that a size of the package may increase.

However, the present invention is not limited thereto, and the fifth insulation unit 45 may be formed by oxidizing the outer surface of the body 10. A method of oxidizing the outer surface of the body 10 is not specifically limited. As an example, the outer surface of the body 10 may be oxidized by supplying oxygen into a chamber. However, the present invention is not limited thereto, and various surface treatment techniques for oxidizing a surface of aluminum may be applied.

In this case, an inner surface and a bottom surface of the body 10 may be processed with a mask to prevent oxidization. The bottom surface and the inner surface of the body 10 may function as a channel for supplying current to the semiconductor device 100. Further, when an inner surface of the cavity 11 is oxidized, a reflectance for UV light may be reduced.

Referring to FIG. 9, a light-transmissive member 50 may be disposed on a top surface of a body 10. In this case, when the light-transmissive member 50 is directly disposed on the top surface of the body 10, the light-transmissive member 50 may not be easily adhered to the top surface of the body 10, because the top surface of the body 10 has relatively low roughness. Therefore, according to the embodiment, a fourth insulating member 44 may be formed on the top surface of the body 10 to increase roughness, and the fourth insulating member 44 may be coated with an adhesive 51 to fix the light-transmissive member 50 thereon. However, the present invention is not limited thereto, and the fourth insulating member 44 may be omitted.

FIGS. 10A to 10E are diagrams illustrating a process of manufacturing a semiconductor device package according to an exemplary embodiment of the present invention.

Figure 10A:
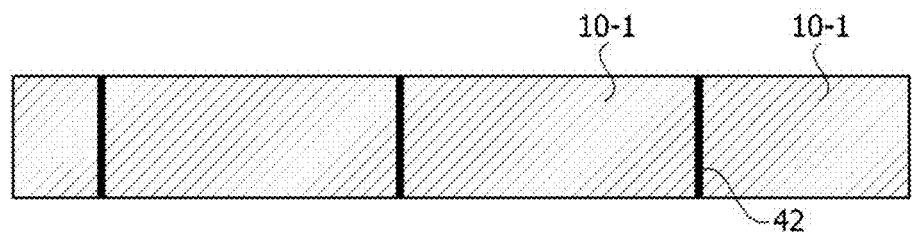
FIGS. 10A to 10E are diagrams illustrating a process of manufacturing a semiconductor device package according to an exemplary embodiment of the present invention.

Referring to FIG. 10A, spaces among a plurality of aluminum substrates 10-1 may be coated with a first insulating member 42 so that the plurality of aluminum substrates 10-1 may be bonded to each other. The first insulating member 42 may include any one of various materials having an insulation function. A thickness of the first insulating member 42 may range from 10 μm to 100 μm. When the thickness of the first insulating member 42 is 10 μm or more, the plurality of aluminum substrates 10-1 may be sufficiently insulated from each other. When the thickness of the first insulating member 42 is 100 μm or less, a problem of increasing the size of a package may be reduced.

Figure 10B:
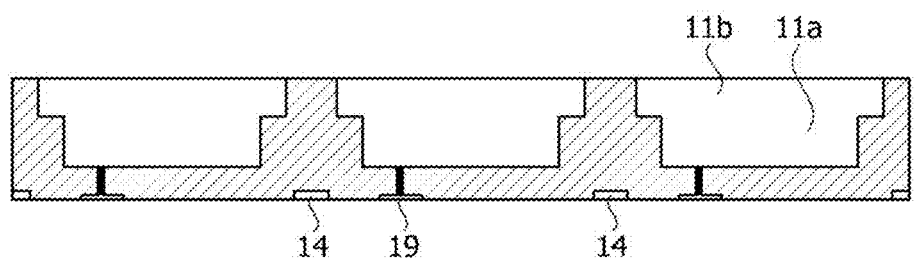
Figure 10C:
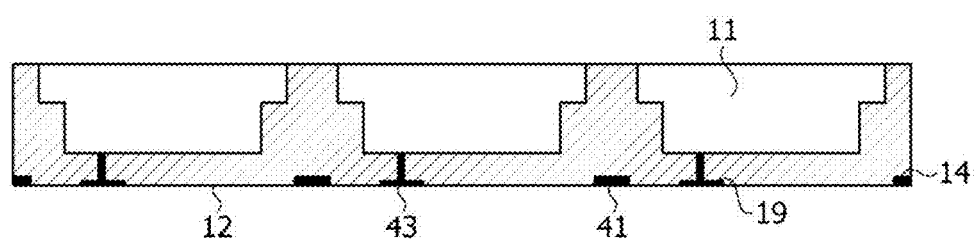

Referring to FIG. 10B, a plurality of cavities 11 may be formed in the plurality of aluminum substrates 10-1. A first cavity 11a in which a semiconductor device is disposed and a second cavity 11b in which a light-transmissive member 50 is disposed may be formed together. A method of forming the cavities 11 is not specifically limited. As an example, any typical metal processing method may be applied.

In this case, a plurality of grooves 14 and 19 may be formed in a bottom surface 12 of the aluminum substrate 10. Thereafter, referring to FIG. 10C, the plurality of grooves 14 and 19 may be coated with a second insulating member 41 and a third insulating member 43. In this case, processes may be simplified, and the second insulating member 41 may be integrally formed with the third insulating member 43 to ensure excellent adhesion.

Figure 10D:
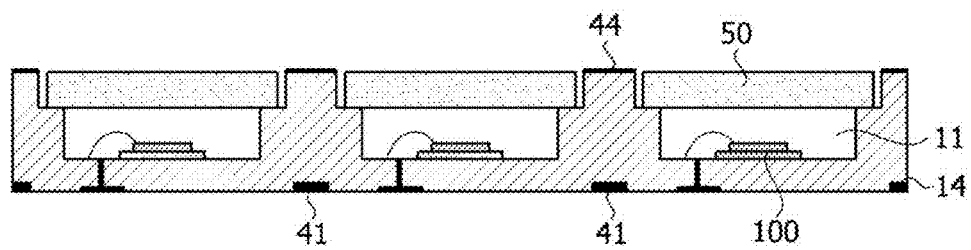

Referring to FIG. 10D, a semiconductor device 100 may be mounted inside the cavity 11, and a light-transmissive member 50 may be disposed on and fixed to the semiconductor device 100. The light-transmissive member 50 may be fixed to the semiconductor device 100 using an additional adhesive.

The semiconductor device 100 may be disposed inside the cavity 11. A sub-mount may be disposed in the cavity 11, and the semiconductor device 100 may be disposed on the sub-mount. A pad unit (not shown) to which a wire is bonded may be disposed on a bottom surface of the cavity 11.

The semiconductor device 100 may output light having a UV wavelength band. As an example, the semiconductor device 100 may output light UV-A having a near-UV wavelength band, output light UV-B having a far-UV wavelength band, or output light UV-C having a deep-UV wavelength band. A wavelength range may be determined by an aluminum (Al) content of an emission structure 120.

A material for the light-transmissive member 50 is not specifically limited and may be any material capable of transmitting light having a UV wavelength band. As an example, the light-transmissive member 50 may include an optical material (e.g., quartz) having a high UV-wavelength transmittance, but the present invention is not limited thereto.

Subsequently, a fourth insulating member 44 may be formed on a top surface of the body 10. A thickness of the fourth insulating member 44 is not specifically limited. Further, a fifth insulation unit may be formed on a side surface 13 of the body 10 when necessary.

The first to fifth insulation members 41, 42, 43, 44, and 45 according to the exemplary embodiment may be formed of a modified epoxy resin composition, such as an EMC, white silicone, PSR, a silicone resin composition, a silicone modified epoxy resin, and the like, a modified silicone resin composition, such as an epoxy-modified silicone resin and the like, and a resin such as a polyimide resin composition, a modified polyimide resin composition, PPA, a polycarbonate resin, a PPS, an LCP, an ABS resin, a phenol resin, an acryl resin, a PBT resin, and the like. However, the present invention is not limited thereto.

Figure 10E:
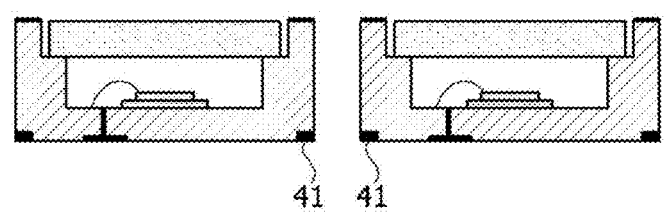

Referring to FIG. 10E, the plurality of aluminum substrates 10-1 may be cut into a plurality of pieces to manufacture a plurality of packages. In this case, a cut surface may pass through a region in which the second insulating member 41 is disposed. As described above, since the second insulating member 41 is disposed at an end of the aluminum body 10, occurrence of burrs may be inhibited during the cutting process.

A semiconductor device may be applied to various kinds of light source devices. As an example, light source devices may be interpreted as including a sterilizing device, a curing device, a lighting device, a display device, a vehicle lamp, and the like. That is, the semiconductor device may be applied to various electronic devices disposed in cases and configured to provide light.

A sterilizing device may include a semiconductor device according to an exemplary embodiment and sterilize a desired region. The sterilizing device may be applied to home appliances, such as a water purifier, an air-conditioner, a refrigerator, and the like, but the present invention is not limited thereto. That is, the sterilizing device may be applied to any one of various products (e.g., medical equipment) that need to be sterilized.

In an example, a water purifier may include a sterilizing device according to an exemplary embodiment to sterilize circulating water. The sterilizing device may be disposed at a nozzle or outlet through which water circulates and emit UV light. In this case, the sterilizing device may include a waterproof structure.

A curing device may include a semiconductor device according to an exemplary embodiment, and the curing device may cure various kinds of liquids. Liquids may be the broadest concept that encompasses a variety of materials that may be cured with UV irradiation. For example, the curing device may cure various kinds of resins. Alternatively, the curing device may be used to cure cosmetic products, such as manicures.

A lighting device may include a light source module including a substrate and a semiconductor device according to an exemplary embodiment, a heat radiation unit configured to radiate heat of the light source module, and a power supply unit configured to process or convert an electric signal provided from the outside and provide the processed or converted electric signal to the light source module. Further, the lighting device may include a lamp, a head lamp, a street lamp, or the like.

A display device may include a bottom cover, a reflection plate, a light-emitting module, a light guide plate (LGP), an optical sheet, a display panel, an image signal output circuit, and a color filter. The bottom cover, the reflection plate, the light-emitting module, the LGP, and the optical sheet may constitute a backlight unit (BLU).

The reflection plate may be disposed on the bottom cover, and the light-emitting module may emit light. The LGP may be disposed in front of the reflection plate and guide light emitted by the light-emitting module forward. The optical sheet may include a prism sheet and may be disposed in front of the LGP. The display panel may be disposed in front of the optical sheet, and the image signal output circuit may supply an image signal to the display panel. The color filter may be disposed in front of the display panel.

When the semiconductor device is used as a BLU of a display device, the semiconductor device may be used as an edge-type BLU or a direct-light-type BLU.

In addition to the above-described light-emitting diode (LED), the semiconductor device may be a laser diode (LD).

Like a light-emitting device, the LD may include the first-conductivity-type semiconductor layer, the active layer, and the second-conductivity-type semiconductor layer, which have the above-described structures. Further, the LD may use an electro-luminescence phenomenon where light is emitted when a p-type first-conductivity-type semiconductor is bonded to an n-type second-conductivity-type semiconductor and current is supplied. However, the LD may differ from the light-emitting device in terms of directionality and phase of the emitted light. That is, the LD may emit light having the one specific wavelength (or monochromatic light) at the same phase in the same direction by using a stimulated emission phenomenon and a constructive interference phenomenon. Due to the above-described characteristics of the LD, the LD may be used for optical communications, medical equipment, semiconductor process equipment, and the like.

Examples of a light-receiving element may include a photodetector, which is a kind of transducer configured to detect light and convert an intensity of the light into an electric signal. Photodetectors may include photocells (silicon, selenium), a photo resistor (cadmium sulfide, cadmium selenide), photodiodes (PDs) (e.g., PDs having peak wavelengths in visible blind spectral regions or true blind spectral regions), phototransistors, photo multiplier tubes (PMTs), photoelectric tubes (vacuum, gas filling), infrared (IR) detectors, and the like, but the embodiment is not limited thereto.

In addition, semiconductor devices, such as photodetectors, typically may be manufactured using a direct-bandgap semiconductor having excellent light conversion efficiency. Alternatively, the photodetectors may have various structures and typically include a pinned photodetector using a p-n junction, a Schottky photodetector using a Schottky junction, a metal-semiconductor-metal (MSM) photodetector, and the like.

A PD may include the first-conductivity-type semiconductor layer, the active layer, and the second-conductivity-type semiconductor layer, which have the above-described structures like the light-emitting device, and have a p-n junction or a pin structure. The PD may operate with application of a reverse bias or a zero bias. When light is incident to the PD, electrons and holes may be generated and current may flow. In this case, a magnitude of the current may be approximately proportional to an intensity of light incident to the PD.

A photocell or a solar cell, which is a kind of the PD, may convert light into current. The solar cell may include the first-conductivity-type semiconductor layer, the active layer, and the second-conductivity-type semiconductor layer, which, like the light-emitting device, have the above-described structures.

In addition, the semiconductor device may be used as a rectifier of an electronic circuit due to rectifying characteristics of a typical diode using a p-n junction, or may be applied to a microwave circuit and used for an oscillation circuit.

Furthermore, the above-described semiconductor device may not necessarily be formed of a semiconductor but may further include a metal material in some cases. For example, a semiconductor device, such as a light-receiving element, may be formed of at least one of silver (Ag), aluminum (Al), gold (Au), indium (In), gallium (Ga), nitrogen (N), zinc (Zn), selenium (Se), phosphorus (P), or arsenic (As), or be formed of a semiconductor material doped with a p-type or n-type dopant or an intrinsic semiconductor material.

As described above, heat radiation efficiency of a semiconductor device package can be improved.

Further, occurrence of burrs can be inhibited during a package cutting process.

In addition, light extraction efficiency can be improved.

Furthermore, a manufacturing process can be simplified, and manufacturing costs can be reduced.

Various advantages and effects of the present invention are not limited by the above descriptions but will be clearly understood from the description of detailed embodiments of the invention.

While this invention has been particularly shown and described with reference to exemplary embodiments thereof, it will be understood by those skilled in the art that various changes and modifications may be made thereto without departing from the spirit and scope of the invention as defined by the appended claims. For example, each component described in detail in the embodiments may be modified and implemented. Differences related to the changes and the applications will be construed as being within the scope of the invention as defined by the appended claims.

What is claimed is:

1. A light emitting device package comprising:
a metal body including a first metal body and second metal body coupled to each other by an insulating member formed therebetween;
a first cavity being formed by a portion of the first metal body, a portion of the second metal body, and a portion of the insulating member, the first cavity having a prescribed depth in a first direction; and
a light emitting device disposed in the first cavity, the light emitting device being electrically connected to the portion of the first metal body and the portion of the second metal body,
wherein the metal body includes a first recess provided below the insulating member, and at least one second recess provided along a periphery of the first and second metal body,
wherein a third resin member disposed in the first recess and a second resin member disposed in the second recess are connected to each other,
wherein the portion of the first metal body forming inner side surfaces of the first cavity reflects ultraviolet light emitted from the light emitting device, wherein the metal body includes an uppermost surface being higher than an upper surface of the light emitting device, wherein a first thickness of the metal body between the uppermost surface of the metal body and a bottom surface of the metal body is greater than a second thickness of the metal body between the uppermost surface of the metal body and an upper surface of the second resin member, wherein a thickness of the second resin member is greater than a thickness of the third resin member, wherein a ratio of the thickness of the second resin member to the width of the second resin member is in a range from 1:1.5 to 1:6, wherein the thickness of the second resin member is 1.5 times the thickness of the third resin member, wherein the thickness of the third resin member is less than at least one half of a distance between a bottom surface of the first cavity and the bottom surface of the metal body, wherein the first metal body and the second metal body include a stepped portion forming a second cavity greater in width than the first cavity, wherein a transparent member is disposed on the stepped portion with recesses formed on all sides of the transparent member such that a bottom surface of the transparent member directly contacts the stepped portion, and wherein the inner side surfaces of the first cavity and the inner side surfaces of the second cavity are perpendicular to the bottom surface of the metal body.

2. The light emitting device package of claim 1, wherein the light emitting device includes a light emitting structure, a first electrode, a second electrode, and a substrate, wherein the light emitting structure includes a first conductivity type semiconductor layer, a second conductivity type semiconductor layer, and an active layer disposed between the first conductivity type semiconductor layer and the second conductivity type semiconductor layer, and wherein the first electrode is electrically connected to the first metal body and the first conductivity type semiconductor layer, and the second electrode is electrically connected to the second metal body and the second conductivity type semiconductor layer.

3. The light emitting device package of claim 2, wherein the first cavity of the metal body includes a first surface, a second surface, and a third surface, wherein an inner surface of the first metal body serves as the first surface of the first cavity, wherein an inner surface of the second metal body serves as the second surface of the first cavity, and wherein an inner surface of the insulating member is provided between the first and second surfaces.

4. The light emitting device package of claim 3, wherein a width of the first recess is larger than a width of the second recess in a second direction, the second direction being different from the first direction.

5. The light emitting device package of claim 4, wherein a ratio between a depth in the first direction and a width in the second direction of the second recess is in a range of 1:1.5~1:6.

6. The light emitting device package of claim 1, wherein the first recess delineates the at least one second recess into a first metal body recess and a second metal body recess, and wherein the first recess and the first and second metal body recesses form at least one closed-loop shape.

7. The light emitting device package of claim 6, wherein the first recess and the first and second metal body recesses merge with each other at an outmost portion of the metal body.

8. The light emitting device package of claim 7, wherein the transparent member covers the cavity, and wherein an air gap is provided between the transparent member and the light emitting device.

9. The light emitting device package of claim 1, wherein the recesses formed on all sides of the transparent member comprise parallel recesses parallel with sides of the transparent member and curved rounded recesses at corners of the transparent member.

10. A light emitting device package comprising:

a resin member having a first through hole and a second through hole;

a metal body disposed on the resin member, and including a first metal body, a second metal body, and an insulating member interposed between the first metal body and the second metal body;

a light emitting device disposed on the metal body, wherein the metal body includes a first cavity having a bottom surface defined by a portion of the first metal body, a portion of the second metal body, and a portion of the insulating member, wherein the light emitting device is electrically connected to the portion of the first metal body on the bottom surface of the first cavity, and the portion of the second metal body on the bottom surface of the first cavity, wherein the first metal body includes a first protrusion on a lower surface thereof, and the second metal body includes a second protrusion on a lower surface thereof, wherein the first protrusion disposed in the first through hole, wherein the second protrusion disposed in the second through hole, wherein the resin member and the insulating member have insulating materials, wherein the insulating material of the resin member is different from the insulating material of the insulating member, wherein the resin member contacts the insulating member, the first metal body, and the second metal body, wherein the resin member includes a third resin member provided below the insulating member, and a second resin member provided along a periphery of the first and second metal body, wherein the portion of the first metal body forming a side surface of the first cavity reflects ultraviolet light emitted from the light emitting device, wherein the metal body includes an uppermost surface, the uppermost surface of the metal body being higher than an upper surface of the light emitting device, wherein a first thickness of the metal body between the uppermost surface of the metal body and a bottom surface of the metal body is greater than a second thickness of the metal body between the uppermost surface of the metal body and an upper surface of the second resin member, wherein a thickness of the second resin member is greater than a thickness of the third resin member, wherein a ratio of the thickness of the second resin member to the width of the second resin member is in a range from 1:1.5 to 1:6, wherein the thickness of the second resin member is 1.5 times the thickness of the third resin member, wherein the thickness of the third resin member is less than at least one half of a distance between a bottom surface of the first cavity and the bottom surface of the metal body, wherein the first metal body and the second metal body include a stepped portion forming a second cavity greater in width than the first cavity, wherein a glass member is disposed on the stepped portion with recesses formed on all sides of the glass member such that a bottom surface of the glass member directly contacts the stepped portion, and wherein the inner side surfaces of the first cavity and the inner side surfaces of the second cavity are perpendicular to the bottom surface of the metal body.

11. The light emitting device package of claim 10, wherein the light emitting device includes a light emitting structure, a first electrode, a second electrode, and a substrate, wherein the light emitting structure includes a first conductivity type semiconductor layer, a second conductivity type semiconductor layer, and an active layer disposed between the first conductivity type semiconductor layer and the second conductivity type semiconductor layer, and wherein the first electrode is electrically connected to the first metal body and the first conductivity type semiconductor layer, and the second electrode is electrically connected to the second metal body and the second conductivity type semiconductor layer.

12. The light emitting device package of claim 11, wherein an outmost side surface of the metal body includes a first outmost side surface, a second outmost side surface opposite to the first outmost side surface, a third outmost side surface, and a fourth outmost side surface opposite to the third outmost side surface, wherein the insulating member pass through the third outmost side surface and the fourth outmost side surface.

13. The light emitting device package of claim 12, wherein a first outmost side surface of the first metal body, a first outmost side surface of the second metal body, and a first outmost side surface of the insulating member are flushed each other to form the third outermost side surface of the metal body, and a second outmost side surface of the first metal body, a second outmost side surface of the second metal body, and a second outmost side surface of the insulating member are flushed each other to form the fourth outmost side surface of the metal body.

14. The light emitting device package of claim 13, wherein the resin member includes an outmost side surface, and wherein a portion of the outmost side surface of the resin member is flushed with the third outmost side surface of the metal body.

15. The light emitting device of claim 10, wherein an air gap is disposed between the light emitting device and the glass.

16. The light emitting device package of claim 10, wherein the recesses formed on all sides of the glass member comprise parallel recesses parallel with sides of the glass member and curved rounded recesses at corners of the glass member.

* * * * *